US009406368B2

(12) United States Patent
Bose et al.

(10) Patent No.: US 9,406,368 B2
(45) Date of Patent: Aug. 2, 2016

(54) DYNAMIC TEMPERATURE ADJUSTMENTS IN SPIN TRANSFER TORQUE MAGNETORESISTIVE RANDOM-ACCESS MEMORY (STT-MRAM)

(71) Applicant: International Business Machines Corporation, Armonk, NY (US)

(72) Inventors: Pradip Bose, Yorktown Heights, NY (US); Alper Buyuktosunoglu, White Plains, NY (US); Xiaochen Guo, Rochester, NY (US); Hillery C. Hunter, Chappaqua, NY (US); Jude A. Rivers, Cortlandt Manor, NY (US); Vijayalakshmi Srinivasan, New York City, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/159,798

(22) Filed: Jan. 21, 2014

(65) Prior Publication Data
US 2015/0206567 A1 Jul. 23, 2015

(51) Int. Cl.
G11C 11/16 (2006.01)
G11C 7/04 (2006.01)

(52) U.S. Cl.
CPC .............. *G11C 11/1675* (2013.01); *G11C 7/04* (2013.01)

(58) Field of Classification Search
CPC ....... G11C 11/1675; G11C 11/16; G11C 7/04
USPC ............. 365/80, 158, 171, 173; 257/421, 427
See application file for complete search history.

(56) References Cited

U.S. PATENT DOCUMENTS

| | | | |
|---|---|---|---|
| 6,701,393 B1 * | 3/2004 | Kemeny | G06F 12/122 710/40 |
| 7,111,177 B1 * | 9/2006 | Chauvel | G06F 1/206 713/300 |
| 7,552,223 B1 | 6/2009 | Ackaouy et al. | |
| 7,930,470 B2 * | 4/2011 | Brittain | G06F 13/1684 711/105 |
| 8,331,183 B2 | 12/2012 | Lee et al. | |
| 8,411,483 B2 | 4/2013 | Lin et al. | |

(Continued)

FOREIGN PATENT DOCUMENTS

| | | |
|---|---|---|
| EP | 2320425 A1 | 5/2011 |
| WO | 2009158274 A1 | 12/2009 |
| WO | 20111430899 A1 | 11/2011 |

OTHER PUBLICATIONS

Ipek, Engin et al; "Dynamically replicated memory: building reliable systems from nanoscale resistive memories.", In ACM SIGARCH Computer Architecture News, vol. 38, No. 1, pp. 3-14. ACM, Mar. 2010.

(Continued)

*Primary Examiner* — Vu Le
*Assistant Examiner* — Sung Cho
(74) *Attorney, Agent, or Firm* — Toler Law Group, P.C.

(57) ABSTRACT

Systems and methods to manage memory on a spin transfer torque magnetoresistive random-access memory (STT-MRAM) are provided. A particular method of managing memory includes determining a temperature associated with the memory and determining a level of write queue utilization associated with the memory. A write operation may be performed based on the level of write queue utilization and the temperature.

13 Claims, 4 Drawing Sheets

(56) References Cited

U.S. PATENT DOCUMENTS

| | | | |
|---|---|---|---|
| 8,713,252 B1* | 4/2014 | de la Iglesia | G06F 13/28 710/52 |
| 2002/0065981 A1* | 5/2002 | Jenne | G06F 13/161 711/105 |
| 2002/0124143 A1* | 9/2002 | Barroso | G06F 11/1064 711/145 |
| 2003/0046020 A1* | 3/2003 | Scheuerlein | G11C 7/04 702/132 |
| 2005/0125797 A1* | 6/2005 | Gabrani | G06F 9/505 718/100 |
| 2006/0179333 A1* | 8/2006 | Brittain | G11C 5/143 713/320 |
| 2008/0046766 A1* | 2/2008 | Chieu | H05K 7/20836 713/300 |
| 2009/0132873 A1 | 5/2009 | Joshi et al. | |
| 2009/0323404 A1 | 12/2009 | Jung et al. | |
| 2011/0119538 A1 | 5/2011 | Ipek et al. | |
| 2011/0280065 A1 | 11/2011 | Rao et al. | |
| 2012/0127804 A1 | 5/2012 | Ong et al. | |
| 2012/0155158 A1 | 6/2012 | Higo et al. | |
| 2012/0257448 A1 | 10/2012 | Ong | |
| 2012/0284589 A1 | 11/2012 | Kim et al. | |
| 2012/0300531 A1 | 11/2012 | Huang et al. | |
| 2013/0073240 A1 | 3/2013 | Kameyama et al. | |
| 2013/0111298 A1 | 5/2013 | Seroff et al. | |
| 2013/0132652 A1 | 5/2013 | Wood et al. | |
| 2013/0205085 A1* | 8/2013 | Hyun | G11C 16/10 711/114 |
| 2013/0227268 A1* | 8/2013 | Ichida et al. | 713/100 |
| 2013/0343117 A1 | 12/2013 | Lua et al. | |
| 2014/0016404 A1 | 1/2014 | Kim et al. | |
| 2014/0098600 A1 | 4/2014 | Kim et al. | |
| 2014/0101371 A1 | 4/2014 | Nguyen et al. | |
| 2014/0112082 A1 | 4/2014 | Lee et al. | |
| 2014/0379940 A1* | 12/2014 | Fulkerson | G06F 3/0659 710/5 |

OTHER PUBLICATIONS

Smullen, Clinton W. et al; , "Relaxing non-volatility for fast and energy-efficient STT-RAM caches," High Performance Computer Architecture (HPCA), 2011 IEEE 17th International Symposium on, pp. 50-61, Feb. 2011.

J.M. Slaughter, "Materials for Magnetoresistive Random Access Memory" Annual Review of Materials Research. vol. 39, Aug. 2009, pp. 277-296.

Liu, et al., "RAIDR: Retention-Aware Intelligent DRAM Refresh," Proceedings of the 39th Annual International Symposium on Computer Architecture (ISCA), Jun. 2012, pp. 1-12.

Y. Chen, et al., "A Nondestructive Self-Reference Scheme for Spin-Transfer Torque Random Access Memory (STT-RAM)," Design, Automation & Test in Europe Conference & Exhibition, Mar. 2010, pp. 148-153.

Zhou, et al., "Energy reduction for STT-RAM Using Early Write Termination," ICCAD 09' Proceedings of the 2009 IEEE/ACM International Conference on Computer-Aided Design, Nov. 2009, pp. 264-268.

* cited by examiner

DYNAMIC TEMPERATURE ADJUSTMENTS IN SPIN TRANSFER TORQUE MAGNETORESISTIVE RANDOM-ACCESS MEMORY (STT-MRAM)

I. FIELD OF THE DISCLOSURE

The present disclosure relates generally to computing architectures, and in particular, to a system and a method of managing memory.

II. BACKGROUND

Spin transfer torque magnetoresistive random-access memory (STT-MRAM) is a non-volatile memory technology. The probability of writing a correct value in an STT-MRAM generally increases with the duration of the write pulse, or write pulse width. Put another way, the more time that is taken to write a value into the memory cell, the more likely that the written value will be correct. There is an upper limit of the write pulse width, beyond which there is either no additional benefit in terms of write reliability. Increased reliability via write pulse width increase is generally obtained at the cost of increased write latency and energy consumption.

III. SUMMARY OF THE DISCLOSURE

In a particular embodiment, a method of managing memory includes determining a temperature associated with the memory and determining a level of utilization associated with the write queue associated with the memory. A write operation may be performed based on the level of said utilization and the temperature. Where advantageous, the overall write apparatus and method may include a false write operation.

The level of memory write queue utilization may be determined based on a high water mark indicator. For instance, the high water mark indicator may be compared to a utilization threshold value. The high water mark indicator may be incremented in response to a received write request and decremented in response to a write request being written into the actual memory data array.

The level of write queue utilization may be determined to be above or below a programmable utilization threshold value, and the temperature may be compared to a latency determining threshold value. The temperature may be continuously monitored. A multiplexer may be configured to receive a first input from a high water mark indicator and a second input from a false write queue. The programming pulse width may be adjusted as part of the write operation. The write operation may further include a bulk write operation that services multiple write requests in a single burst of write cycles.

According to another particular embodiment, an apparatus includes a memory storing data and program code. A temperature sensor may be configured to determine a temperature associated with the memory. A controller may be in communication with the memory and the temperature sensor. The controller may be configured to receive the temperature and to execute the program code to determine a level of queue utilization associated with the memory, as well as to perform a write operation based on the level of said utilization and the temperature.

A false write queue may be configured to generate a false write request during the write operation. A false write operation in may be halted in response to at least one of: a detection of a desired temperature, an expiration of a time period, and a queue full indication. The controller may further be configured to determine a level of write queue utilization based on a high water mark indicator. The controller may adjust a programming pulse width as part of the write operation. A multiplexer may be configured to receive a first input from a high water mark indicator and a second input from a false write queue.

According to another particular embodiment, a computer readable storage medium includes instructions, that when executed by a processor, cause the processor to determine a temperature associated with the memory, to determine a level of queue utilization associated with the memory, and to determine a write operation based on the level of said utilization and the temperature.

An embodiment may manage write operations in an STT-MRAM in a manner that reduces power (or energy) consumption and processing latency. For example, variably adjusting a length of a programming pulse width may reduce power consumption by using shorter lengths when higher temperatures are present. Processes may be transparent to a main memory controller, e.g., only the microchip may be aware of a changing latency. False writes may be used to increase the temperature in the STT-MRAM. The increased temperature may result in decreased write latency.

Features and other benefits that characterize embodiments are set forth in the claims annexed hereto and forming a further part hereof. However, for a better understanding of the embodiments, and of the advantages and objectives attained through their use, reference should be made to the Drawings and to the accompanying descriptive matter.

IV. BRIEF DESCRIPTION OF THE DRAWINGS

FIG. 1 generally illustrates a data processing apparatus configured to support embodiments to manage memory by adjusting programming pulse widths according to known bit error rate relationships;

V. DETAILED DESCRIPTION

Figure 1:
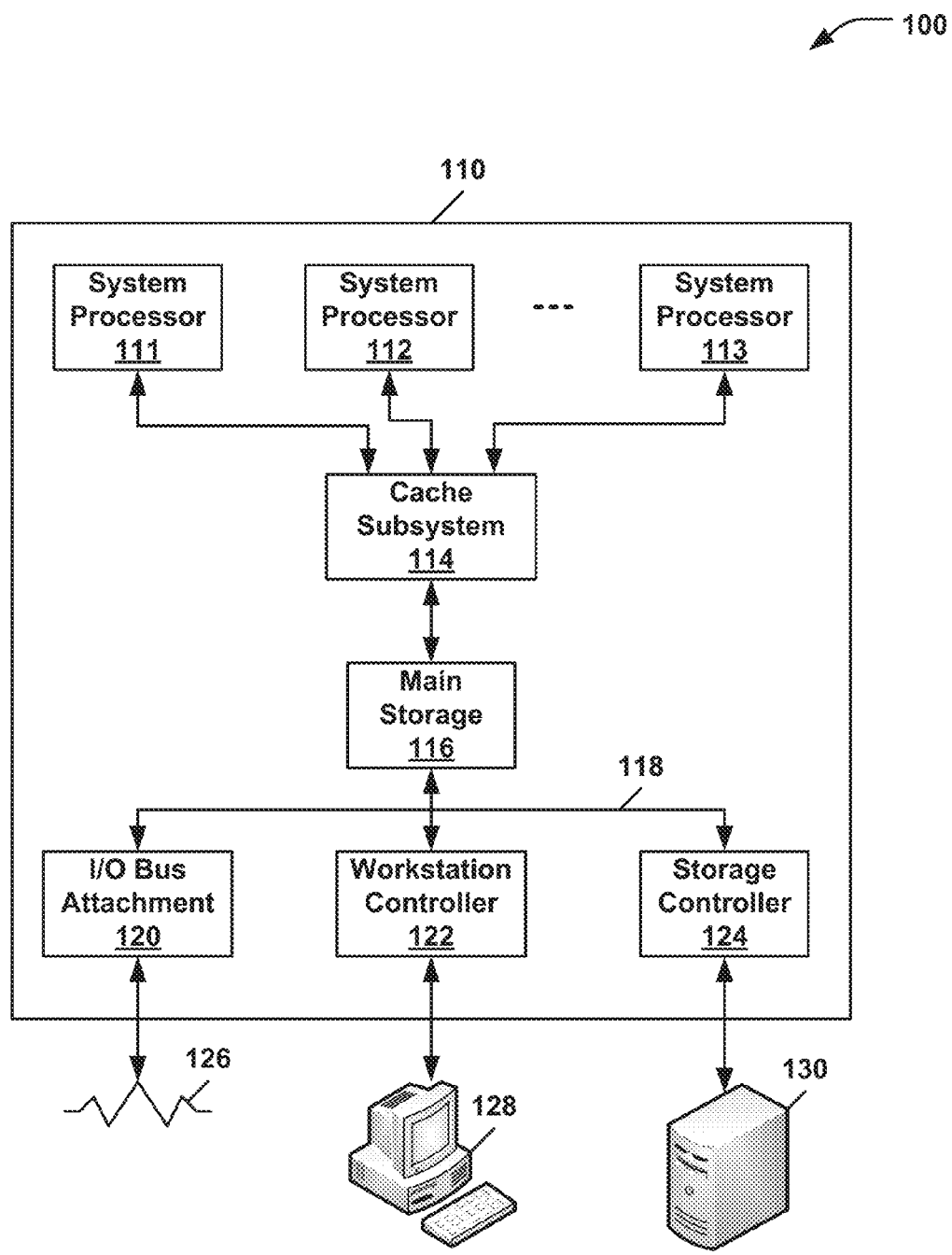

Programming pulse widths may be continuously adjusted based on sensed temperatures in an STT-MRAM. One or more temperature sensors on the STT-MRAM microchip may be continuously monitored to adjust the programming pulse width. Write latency may be improved by using shorter programming pulse widths in response to higher temperatures. Longer programming pulse widths may be used at lower temperatures according to the adaptive scheme. An embodiment capitalizes on the fact that the write latency required to achieve a targeted level of reliability is inversely related to the operating temperature of the memory data array and associated logic.

An STT-MRAM microchip with temperature sensors may enable the automatic adjustment of microchip-wide programming pulse width writes. A cache system of the STT-MRAM may cluster write operations to a physical section of the cache. The clustering may increase a probability that shorter writes are performed (e.g., Most Recently Written, Most Frequently Written, or Most Recently Used sets of a cache may all be physically adjacent locations).

False writes, or dummy writes, may be introduced within or close to the STT-MRAM with the purpose of intentionally increasing temperature. Three-dimensional integration of the writes may be performed on a separate layer (e.g., STT-MRAM could be placed directly above processor the cores).

As the temperature in an STT-MRAM increases, writes to the STT-MRAM may be performed in less time. Additionally, writes in an STT-MRAM have a heating effect. Reads in an STT-MRAM, incidentally, are accomplished at a relatively low voltage and do not have a heating effect. Because increasing the temperature may negatively affect system retention and reliability, the number of false write requests issued may be regulated in terms of a detected temperature, an expired time limit, or a detected memory capacity.

Local temperature sensors of an STT-MRAM may enable an automatic adjustment of write pulse length, or programming pulse length. As such, a length of a programming pulse width may be determined based on the sensed temperature. For example, shorter programming pulse widths may be used in connection with higher temperatures, and longer programming pulse widths may be used in the presence of lower temperatures.

Embodiments of methods have application in page-based designs. For instance, where slow writes have been performed to multiple Column Address Strobe (CAS) latency locations in a page, subsequent writes to that page may be performed with fast writes, since prior activity may have warmed the page.

Write latency may be improved with dynamic temperature adjustment in an STT-MRAM. Embodiments of methods exploit the natural physical phenomena that as temperature increases, writes to STT-MRAM become faster. Benefits from higher temperatures (e.g., associated with higher voltages) may be realized at a cost of reliability. Retention time in the STT-MRAM may be reduced with higher temperatures. The reduced retention time may translate into diminished reliability.

Write performance in an STT-MRAM may depend on a length of a programming pulse width, or the length of the pulse used to write the data. For example, longer programming pulse widths may result in higher power consumption and greater accuracy. The amount of time elapsing during the write operation to the STT-MRAM is referred to as write pull switch, write pull length, or write latency.

Embodiments may include adaptive programming pulse widths to write to memory according to stored relationships. The relationships may associate one or more of a bit error rate, a temperature, a voltage, historical predictive data, and coding. Coding may include additional error handling and redundancy processes (e.g., parity coding, error correction code (ECC), and memory mirroring) used to increase reliability given a particular programming pulse width and varying parameters.

Methods may vary write latency and programming pulse width capability. For example, an internal write latency of a microchip may defer, while an external write latency remains constant. A microchip may include an internal thermal sensor. Where the microchip determines a high temperature condition is present, a short programming pulse width may be adequate and consequently used. Where the microchip is alternatively at a low temperature, a long programming pulse width may be used. Determining whether to use a long or short programming pulse width based on a detected microchip temperature may preserve power because shorter write latencies (which use relatively less power) are used when higher temperatures are present. Processes may be transparent to a main memory controller, e.g., only the microchip may be aware of a changing latency.

Embodiments of methods exploit the natural physical phenomena that as temperature increases, writes to STT-MRAM become faster. Benefits from higher temperatures (e.g., associated with higher voltages) may be realized at a cost of reliability. Retention time in the STT-MRAM may be reduced with higher temperatures. The reduced retention time may translate into diminished reliability. Known relationships may be leveraged to provide a desired level of reliability.

Turning more particularly to the drawings, FIG. 1 generally illustrates a data processing apparatus 100 configured to support embodiments to manage memory by dynamically adjusting at least one of programming pulse widths and temperatures to facilitate writes. The apparatus 100 may generally include a computer, a computer system, a computing device, a server, a disk array, client computing entity, or other programmable device, such as a multi-user computer, a single-user computer, a handheld device, a networked device (including a computer in a cluster configuration), a mobile phone, a video game console (or other gaming system), etc. The apparatus 100 may be referred to as a logically partitioned computing system or computing system, but may be referred to as computer for the sake of brevity. One suitable implementation of the computer 110 may be a multi-user computer, such as a computer available from International Business Machines Corporation (IBM).

The computer 110 generally includes one or more physical processors 111, 112, 113 coupled to a memory subsystem including a main storage 116. The main storage 116 may include one or more STT-MRAMs. Another or the same embodiment may contain a main storage having a static random access memory (SRAM), a dual in-line memory module (DIMM) a flash memory, a hard disk drive, and/or another digital storage medium. The processors 111, 112, 113 may be multithreaded and/or may have multiple cores. A cache subsystem 114 is illustrated as interposed between the processors 111, 112, 113 and the main storage 116. The cache subsystem 114 typically includes one or more levels of data, instruction and/or combination caches, with certain caches either serving individual processors or multiple processors.

The main storage 116 may be coupled to a number of external input/output (I/O) devices via a system bus 118 and a plurality of interface devices, e.g., an I/O bus attachment interface 120, a workstation controller 122, and/or a storage controller 124 that respectively provide external access to one or more external networks 126, one or more workstations 128, and/or one or more storage devices 130, such as a direct access storage device (DASD). In a particular embodiment, the storage device 130 may include an STT-MRAM. The system bus 118 may also be coupled to a user input (not shown) operable by a user of the computer 110 to enter data (i.e., the user input sources may include a mouse, a keyboard, etc.) and a display (not shown) operable to display data from the computer 110 (i.e., the display may be a CRT monitor, an LCD display panel, etc.). The computer 110 may also be configured as a member of a distributed computing environment and communicate with other members of that distributed computing environment through a network 126.

Figure 2:
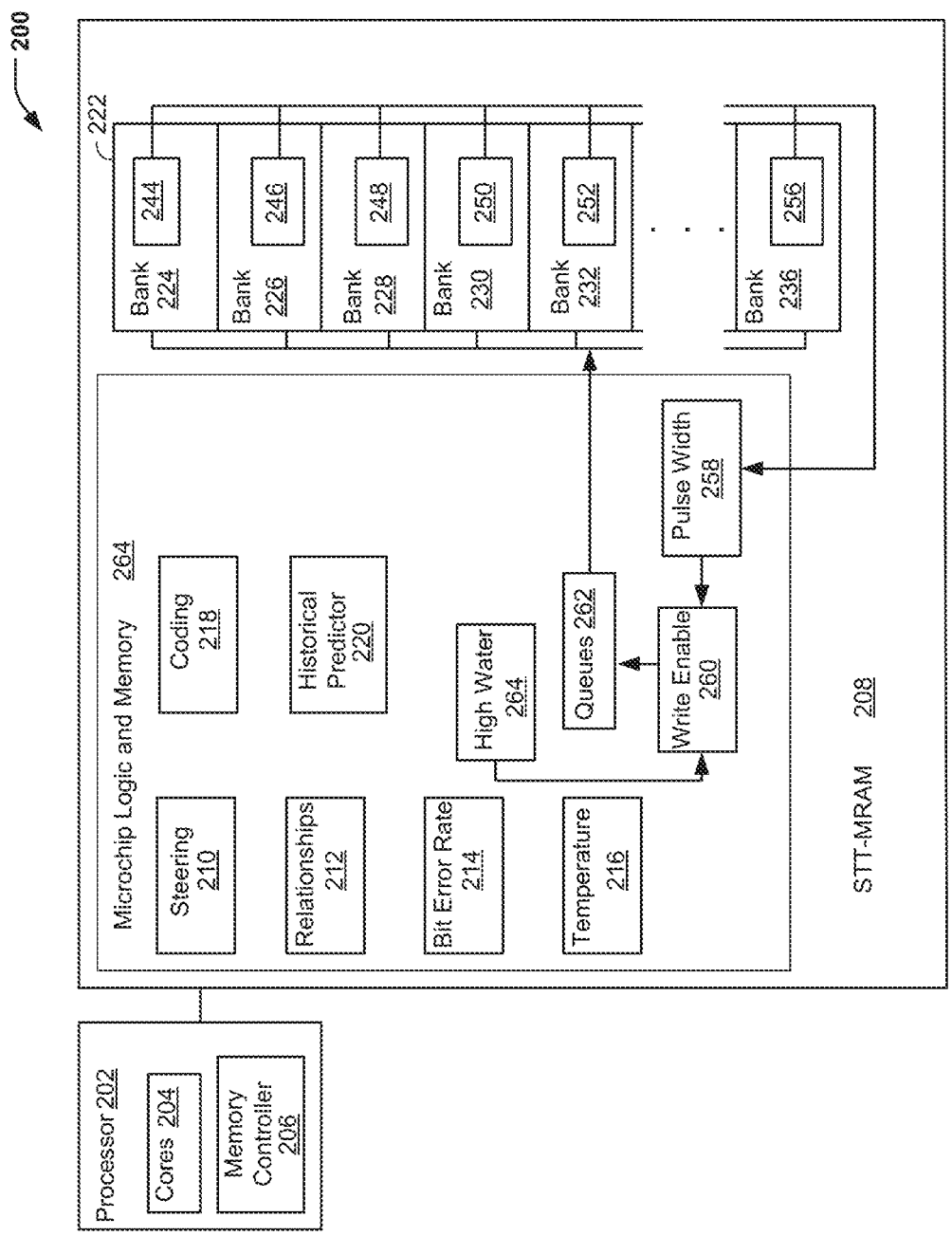
FIG. 2 shows an embodiment of a system configured to manage memory operations using bit error rate relationships in an STT-MRAM.

FIG. 2 shows an embodiment of a system 200 configured to manage memory operations by dynamically adjusting programming pulse widths according to temperature and other performance parameters in an STT-MRAM 208. The system 200 may generally be supported within the computing environment 100 of FIG. 1. The system 200 may manage write operations in an STT-MRAM 208 by sending and adjusting for temperatures in a manner that reduces power consumption and processing latency.

A processor microchip 202 of the system 200 may continuously send memory requests to the STT-MRAM 208. As shown in FIG. 2, the processor microchip 202 may include processor cores 204 and a main memory controller 206.

The STT-MRAM 208 may include multiple memory banks 224, 226, 228, 230, 232, 236. Each memory bank 224, 226, 228, 230, 232, 236 may be associated with a respective one of a number of queues 262. The memory requests from the processor microchip 202 may be addressed for a specific memory bank 224, 226, 228, 230, 232, 236 and an associated one of the queues 262. A steering module 210 of the system 200 may direct the memory requests to the appropriate queue 262 according to an address of the destination memory bank 224, 226, 228, 230, 232, 236.

A high water mark module 264 may facilitate management of incoming memory requests by accounting and adjusting for the incoming and outgoing traffic. For example, the high water mark module 264 may indicate the fullness (e.g., of waiting write requests) of a particular queue 262. The high water mark module 264 may be incremented in response to an incoming memory request and may be decremented whenever a memory request at the head of the queue 262 is issued to an appropriate memory bank 224, 226, 228, 230, 232, 236. When a queue 262 associated with a memory bank 224 becomes full, it may no longer receive new memory requests.

The memory banks 224, 226, 228, 230, 232, 236 may include one or more temperature sensors 244, 246, 248, 250, 252, 256. The temperature sensors 244, 246, 248, 250, 252, 256 may individually or collectively detect an average temperature of a memory bank or array of memory banks 224, 226, 228, 230, 232, 236. One skilled in the art will appreciate that the array may include any number of memory banks, including a number that is a power of two.

A pulse width determiner 258 may adjust the programming pulse width for writing to the specific memory bank or the multiple memory banks 224, 226, 228, 230, 232, 236 based on the detected temperature 216, as well as on other inputs. Illustrative such inputs may include one or more of a desired coding strength 218, an application requirement 220, and a history based predictive performance parameter 220 associated with past performance of the system.

Relationship information 212 may be stored in a manner that is accessible to the pulse width determiner 258. In a particular embodiment, the relationship information 212 includes bit error rates for the STT-MRAM 208 stored versus one or more of: programming pulse width, temperature, coding, and voltage. Voltage in some cases may vary proportionally with temperature. Incidentally, comparable relationships do not exist for dynamic random-access memory (DRAM). While such relationship information 212 is shown in FIG. 2 as being stored internally to the STT-MRAM 208, such relationship information may be stored elsewhere in another embodiment. Additionally, while an STT-MRAM is illustrated in FIG. 2, another embodiment may include another memory variant having characteristics advantageously affected by the processes described herein.

The programming pulse width determined by the pulse width determiner 258 may be provided as an input to a write enable module 260. Another input to the write enable module 260 may be provided by the high water mark module 264. Based on these inputs, the write enable module 260 may write the memory request sitting at the head of the queue 262 to the designated bank 232 with the determined programming pulse width. The write process, including the programming pulse width, may be continuously adjusted in this manner based on the temperature and other inputs from the stored relationship information 212.

Figure 3:
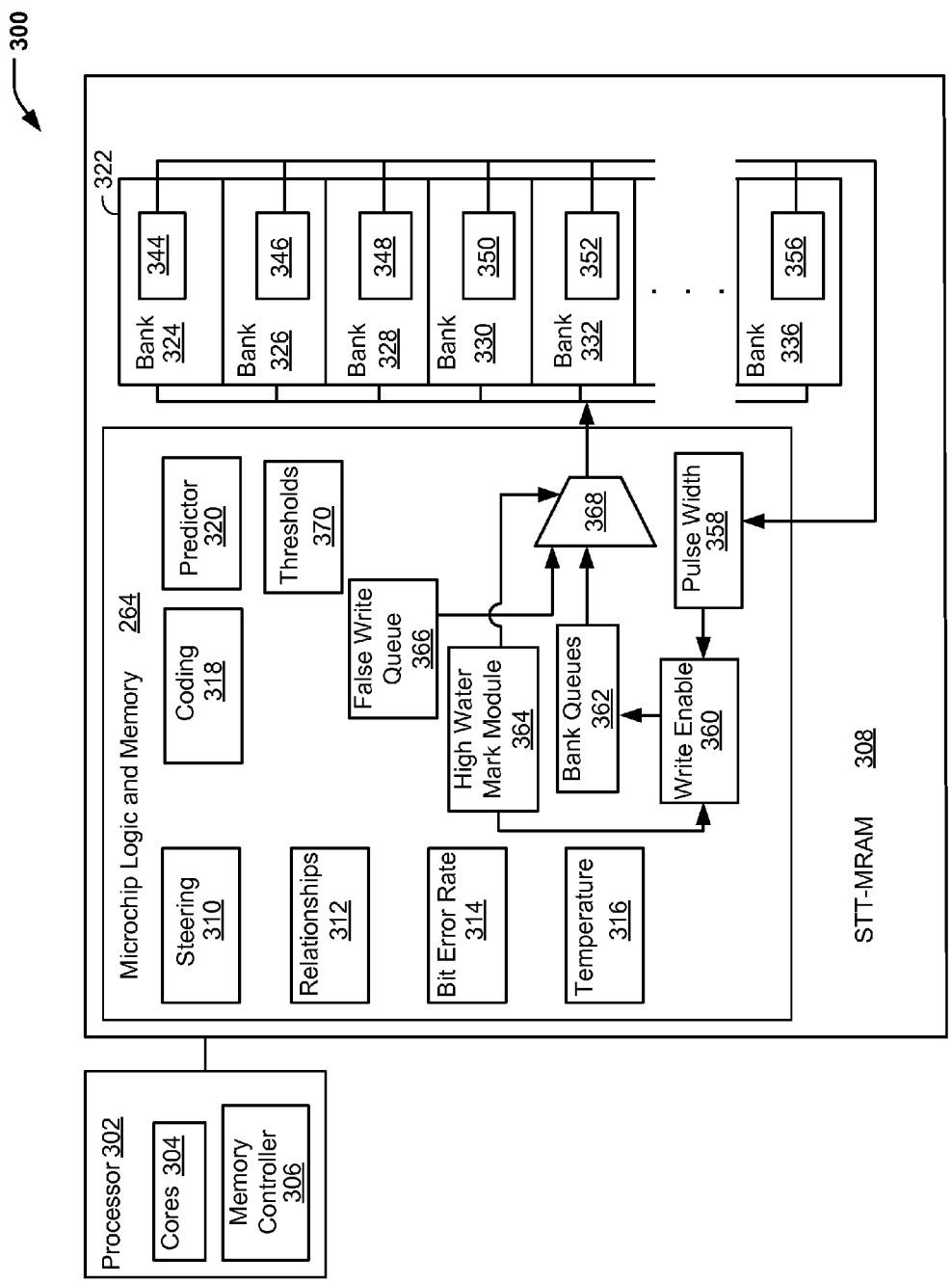
FIG. 3 is a block diagram illustrating a system having inputs executed by logic of a pulse width determiner.

FIG. 3 shows a system 300 configured to adjust a programming pulse width and a temperature based on a detected temperature in an STT-MRAM 304. The system 300 may adjust the temperature using false writes. The false writes may increase the temperature and reduce latency.

Similar to the system 200 of FIG. 2, a processor microchip 302 may continuously send memory requests to an STT-MRAM 308. The system 300 includes a false write queue 366 and a multiplexer 368 in between a bank queue 362 and memory banks 324, 326, 328, 330, 332, 336 of a cache 322.

The multiplexer 368 may select one or more inputs to write to a memory bank 324, 326, 328, 330, 332, 336. A first input at the multiplexer 368 may be received from bank queue 362. The memory bank queue 362 may temporarily store received memory requests. Another input received at the multiplexer 368 may originate from the false write queue 366. The input (i.e., a false request) may be a non-functional write request used to increase the temperature in the STT-MRAM 308. The increased temperature may result in decreased write latency.

In one example, false requests may be sent when the arrival rate of legitimate, real write requests is relatively low. For instance, the high water mark module 364 may indicate that there is not a backlog of write requests in the memory bank queue 362. For example, a threshold number 370 of write requests may be present in the memory bank queue 362. The false requests may thus decrease latency while not significantly disrupting write operations. The false request may continue to be sent (and the latency may be reduced) until the high water mark module 364 indicates an increased number of write requests in the bank queue 362, until the expiration of a preset period, or until a desired temperature (e.g., stored as a threshold value 370) is detected.

In one example, while waiting for regular requests, a sitting module of the system may rewrite values that have already been sent and stored to a memory bank 324, 326, 328, 330, 332, 336. No extra storage space may be used and baseline performance may not be significantly affected because there are not that many real write requests waiting in the memory bank queue 362. Where the high water mark module 364 indicates an increased number of write requests in the memory bank queue 362, where a preset period has expired, or where the desired temperature is detected, the system 300 may use the multiplexer 368 to select the bank queue 362 as the source for populating a memory bank 324, 326, 328, 330, 332, 336. Additionally, the extra waiting time resultant from a sequence of non-functional write requests may facilitate writing numerous real write requests in a burst, due to accumulation of said write requests. As in the system of FIG. 2, values from other modules 312, 314, 318, 320 may be considered by the pulse width determination module 358 in setting a programming pulse width. In this manner, both actual and false write requests may combine to maintain the STT-MRAM 304 at a desired temperature and with an associated write latency.

Figure 4:
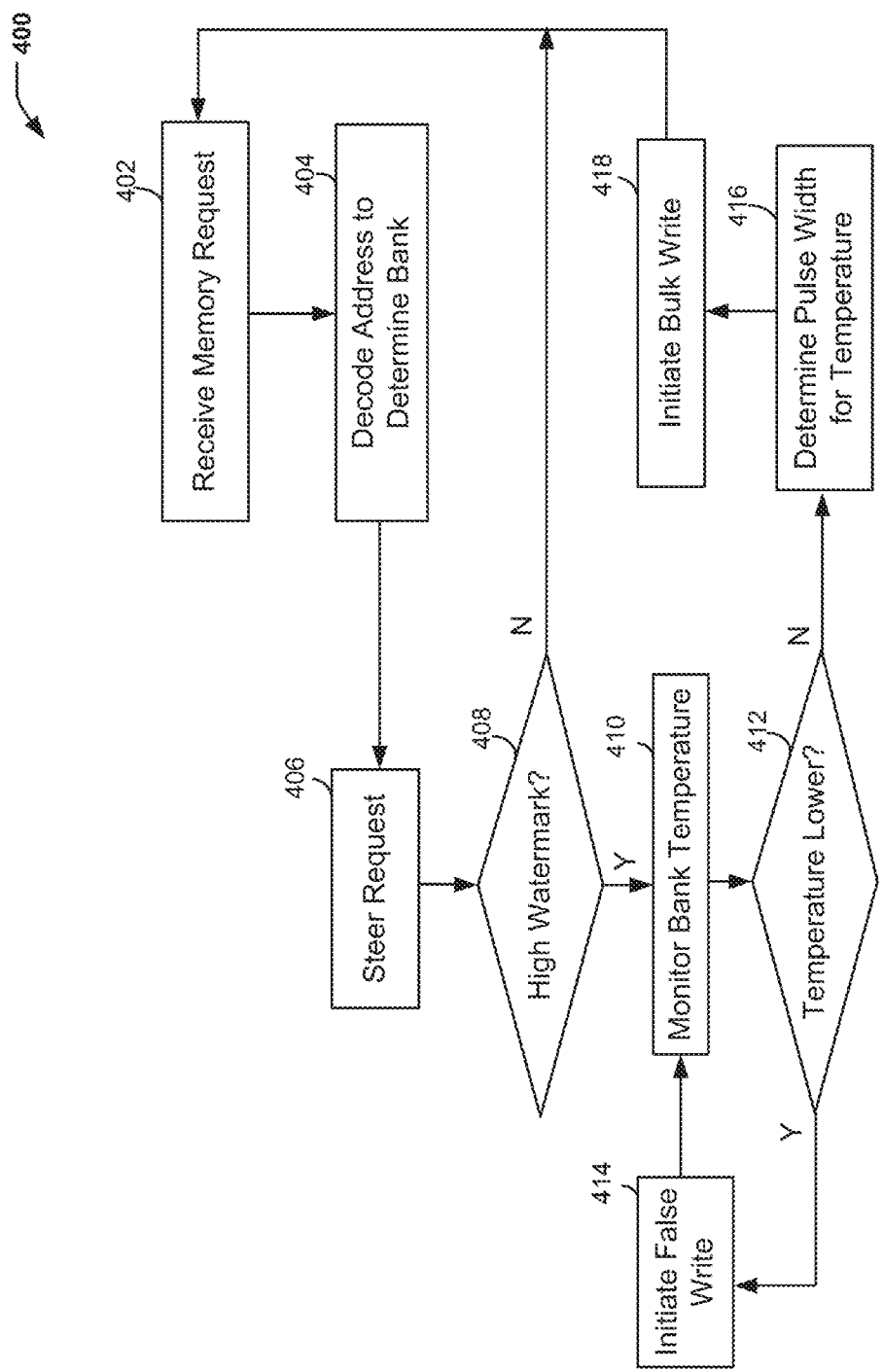
FIG. 4 is flowchart illustrating an embodiment of a method of managing memory that includes determining programming pulse width at least in part by a temperature of an STT-MRAM microchip.

FIG. 4 is a flowchart of an embodiment of a method 400 of writing to an STT-MRAM in a manner that maintains a desired temperature and an associated write latency. Turning more particularly to the flowchart, the system may receive at 402 a memory write request. The address of the write request may be decoded at 404 to determine the memory bank to which the request should be written. The write request may be steered at 406 to the determined memory bank.

At 408, the system may determine if the queue has not reached a high water mark. As discussed herein, the high water mark may include a programmable value or threshold that is indicative of the how much of the memory write queue resource is being utilized (e.g., available memory queue capacity). Where the high water mark indicator has been reached at 408, the system may receive a next memory request at 402.

Alternatively, where the high water mark has not been reached at 408, the system may at 410 monitor the bank memory temperature. The system may determine at 412 whether the detected temperature is lower than a latency determining threshold. Where the temperature has fallen below the latency determining threshold, the system may invoke at 414 a false write process. The false write(s) may increase the temperature, and in so doing, lower the latency in the STT-MRAM. Put another way, a false write request may be initiated if the temperature is too low. The false write(s) may be issued before an actual write request goes through because the temperature is too low before the false write request to gauge the regular write process (e.g., at the desired temperature and latency). The system may return to monitoring the memory bank temperature at 410.

Where the temperature is determined at 412 to be higher than the latency determining threshold, the programming pulse width associated with the temperature may be determined at 416. A few actual write requests that accumulate as the temperature is raised may be delivered under desired temperature and latency conditions in bulk at 418. Bulk writes have the added advantage of further increasing bank temperature without recourse to false writes.

Particular embodiments described herein may take the form of an entirely hardware embodiment, an entirely software embodiment or an embodiment containing both hardware and software elements. In a particular embodiment, the disclosed methods are implemented in software that is embedded in processor readable storage medium and executed by a processor, which includes but is not limited to firmware, resident software, microcode, etc.

Further, embodiments of the present disclosure, such as the one or more embodiments may take the form of a computer program product accessible from a computer-usable or computer-readable storage medium providing program code for use by or in connection with a computer or any instruction execution system. For the purposes of this description, a non-transitory computer-usable or computer-readable storage medium may be any apparatus that may tangibly embody a computer program and that may contain, store, communicate, propagate, or transport the program for use by or in connection with the instruction execution system, apparatus, or device.

In various embodiments, the medium may include an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and digital versatile disk (DVD).

A data processing system suitable for storing and/or executing program code may include at least one processor coupled directly or indirectly to memory elements through a system bus. The memory elements may include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) may be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. An apparatus comprising:
a memory storing data and program code;
a temperature sensor configured to determine a temperature associated with the memory; and
a controller in communication with the memory and the temperature sensor, the controller configured to:
receive the temperature;
execute the program code to determine a level of write queue utilization associated with the memory; and
perform a write operation based on the temperature and based on whether the level of write queue utilization has reached a high water mark indicator, wherein the high water mark indicator is incremented in response to receiving a first write request and decremented in response to writing a second write request to the memory.

2. The apparatus of claim 1, further comprising a false write queue configured to generate a false write request during the write operation.

3. The apparatus of claim 1, wherein the high water mark indicator corresponds to a threshold number of requests in the write queue.

4. The apparatus of claim 1, wherein the controller is further configured to adjust a programming pulse width during the write operation.

5. The apparatus of claim 1, further comprising a multiplexer configured to receive the high water mark indicator as a first input, and to receive a second input from a false write queue.

6. A non-transitory computer readable storage medium comprising instructions, that when executed by a processor, cause the processor to:
determine a temperature associated with a memory;
determine a level of write queue utilization associated with the memory; and
determine a write operation based on the temperature and based on whether the level of write queue utilization has reached a high water mark indicator, wherein the high water mark indicator is incremented in response to receiving a first write request and decremented in response to writing a second write request to the memory.

7. The apparatus of claim 1, wherein the controller is further configured to stop false writes when the temperature associated with the memory reaches a particular temperature.

8. The apparatus of claim 1, wherein the controller is further configured to increase the temperature associated with the memory by performing a false write operation when the level of write queue utilization is less than the high water mark indicator.

9. The apparatus of claim 1, wherein the high water mark indicator corresponds to a programmable threshold value.

10. The apparatus of claim 1, wherein the controller is further configured to determine that the temperature associated with the memory is less than a latency-determining threshold value.

11. The apparatus of claim 1, wherein the controller is further configured to perform a bulk write operation that services multiple write requests.

12. A non-transitory computer readable storage medium comprising instructions, that when executed by a processor, cause the processor to:

determine a temperature associated with a memory;

determine a level of write queue utilization associated with the memory; and determine whether to perform a false write operation based on the temperature and based on whether the level of write queue utilization has reached a high water mark indicator, wherein the high water mark indicator is incremented in response to receiving a first write request and decremented in response to writing a second write request to the memory.

13. The apparatus of claim 1, wherein the controller is further configured to:

adjust a programming pulse width based on the temperature in response to determining that the temperature is greater than a latency-determining threshold; and perform a bulk write operation based on the programming pulse width.

* * * * *